United States Patent
Hirao et al.

(10) Patent No.: US 6,831,351 B2
(45) Date of Patent: Dec. 14, 2004

(54) SEMICONDUCTOR DEVICE WITH SEMICONDUCTOR CHIP FORMED BY USING WIDE GAP SEMICONDUCTOR AS BASE MATERIAL

(75) Inventors: Masayoshi Hirao, Fukuoka (JP); Katsumi Satou, Tokyo (JP); Shigeo Tooi, Tokyo (JP); Kazushige Matsuo, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 35 days.

(21) Appl. No.: 10/208,980

(22) Filed: Aug. 1, 2002

(65) Prior Publication Data

US 2003/0155644 A1 Aug. 21, 2003

(30) Foreign Application Priority Data

Feb. 21, 2002 (JP) ...................................... 2002-044666

(51) Int. Cl.⁷ .............................................. H01L 29/06
(52) U.S. Cl. ..................... 257/625; 257/675; 257/706; 257/707; 257/796; 438/122; 438/123; 438/125
(58) Field of Search ................................ 257/625, 675, 257/705–707, 796, 81, 99, 177–181, 584, 688, 689, 712–722; 438/122, 123–127, 22, 24, 117

(56) References Cited

U.S. PATENT DOCUMENTS

2003/0020161 A1 * 1/2003 Saitoh et al. ................ 257/706

FOREIGN PATENT DOCUMENTS

JP      11-274482      10/1999

* cited by examiner

Primary Examiner—Hoai Ho
Assistant Examiner—Long Tran
(74) Attorney, Agent, or Firm—Oblon, Spivak, McClelland, Maier & Neustadt, P.C.

(57) ABSTRACT

A switching chip (101) using silicon as the base material is located on the upper surface of a cooling mechanism formed of a heat sink (115), an insulating substrate (114) and a conductive plate (108), with a first conductive layer (109A) sandwiched in between. Further, a diode chip (102) having a smaller area than a cathode electrode (103) and using a wide gap semiconductor as the base material is located on the cathode electrode (103) which has a smaller area than an anode electrode (105), with a second conductive layer (109B) sandwiched in between. A closed container (117) encloses every structural component except an exposed portion of a bottom surface (115BS) in the interior space.

4 Claims, 9 Drawing Sheets

F I G. 6
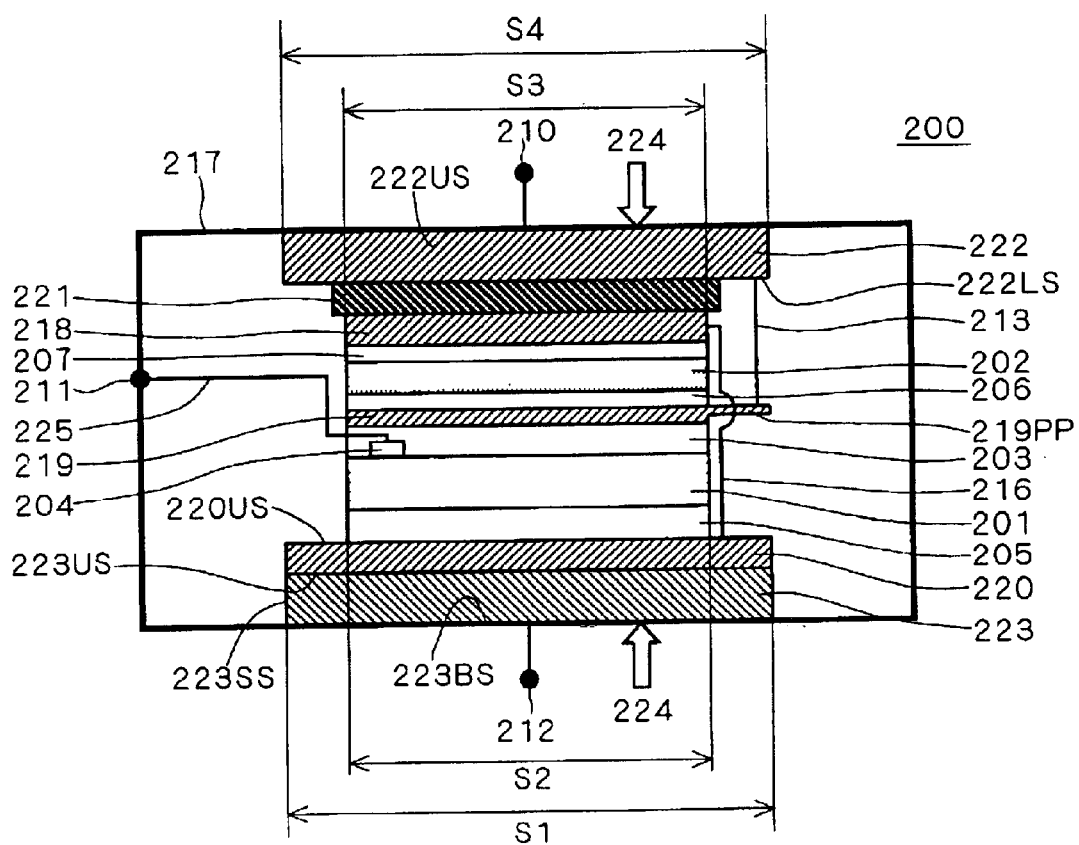

SEMICONDUCTOR DEVICE WITH SEMICONDUCTOR CHIP FORMED BY USING WIDE GAP SEMICONDUCTOR AS BASE MATERIAL

BACKGROUND OF THE INVENTION

1. Field of the Invention

The present invention relates to a semiconductor device comprising first and second semiconductor chips which are contained in a single package and at least one of which is formed by using a wide gap semiconductor (such as silicon carbide or gallium nitride) as the base material. The following description of the present invention centers mainly on semiconductor devices for use in high voltage applications; however, the present invention is not limited to such power semiconductor devices but could be used with any kind of semiconductor devices.

2. Description of the Background Art

In applications to voltage-source inverters, in general, a switching chip having switching capability and a circulating diode chip are connected in inverse-parallel with each other.

FIG. 9 is a longitudinal cross-sectional view illustrating the configuration of a conventional module element 400 for use in voltage-source inverters. Active elements of the module element 400 each are formed by using silicon as the base material. That is, a switching chip 401 and a diode chip 402 contained in a closed container 417 are both made of silicon. The switching chip 401 has a cathode electrode 403 and a control electrode 404 formed on the front surface and an anode electrode 405 formed on the rear surface. The diode chip 402 has an anode electrode 406 formed on the front surface and a cathode electrode 407 formed on the rear surface. The anode electrode 405 of the switching chip 401 and the cathode electrode 407 of the diode chip 402 are electrically connected to each other by being soldered to a conductive plate 408 by a solder layer 409. The cathode electrode 403 and the control electrode 404 of the switching chip 401 are connected respectively to a cathode conducting bar 410 and a control conducting bar 411 by a bonding wire 413, and the anode electrode 406 of the diode 402 is connected by the bonding wire 413 to the cathode conducting bar 410. The conductive plate 408 is connected through an insulating substrate 414 to a heat sink 415 having cooling capability. Also, the conductive plate 408 is electrically connected through a metal body 416 to an anode conducting bar 412.

In this configuration, heat generated by the energy losses of the chips 401 and 402 can be dissipated from their respective rear electrodes 405 and 407 to the outside through the path formed of the solder layer 409, the conductive plate 408, the insulating substrate 414 and the heat sink 415.

However, in the configuration of the conventional module element 400 illustrated in FIG. 9, since the switching chip 401 and the diode chip 402 are both electrically and mechanically connected to the conductive plate 408, even the use of the low-loss wide gap semiconductor for production of the switching chip 401 and/or the diode chip 402 can achieve neither simplification of an element cooling mechanism nor significant reductions in the size and weight of the closed container 417 or the module element 400 itself. Accordingly, even if the chips in the module element with the configuration of FIG. 9 are replaced by wide gap semiconductor chips, reductions in the cost of the semiconductor device cannot be achieved.

SUMMARY OF THE INVENTION

The present invention has been made to solve the aforementioned conventional problems and an object thereof is to achieve significant simplification of an element cooling mechanism by providing a way to locate a semiconductor chip in a position where in the conventional module element having active elements formed of only semiconductor chips using silicon as the base material, the chips cannot be placed for reasons of the design of heat dissipation. Another object of the present invention is to achieve reductions in the size, weight and cost of a module element having a wide gap semiconductor chip.

According to an aspect of the present invention, the semiconductor device includes a heat sink, an insulating substrate, a conductive plate, a first semiconductor chip, a second semiconductor chip and a container. The heat sink has a bottom surface exposed to the outside and an upper surface opposed to the bottom surface. The insulating substrate is jointed to the upper surface of the heat sink, and the conductive plate is jointed to an upper surface of the insulating substrate. The first semiconductor chip has a first main electrode electrically connected through a first conductive layer to an upper surface of the conductive plate, and a second main electrode opposed to and having a smaller area than the first main electrode. The second semiconductor chip has a first main electrode electrically connected through a second conductive layer to and having a smaller area than the second main electrode of the first semiconductor chip, and a second main electrode opposed to the first main electrode. The container encloses the heat sink except an exposed portion of the bottom surface, the insulating substrate, the conductive plate, the first semiconductor chip and the second semiconductor chip in its interior space. A portion above the second main electrode of the second semiconductor chip is the interior space of the container, and a base material of the second semiconductor chip is a wide gap semiconductor having a greater interband energy gap than silicon.

The second semiconductor chip can, without decline of its capabilities, be placed in a position farther from an element cooling mechanism formed of the heat sink, the insulating substrate and the conductive plate (i.e., in a position where a silicon semiconductor chip cannot be placed for reasons of the design of heat dissipation), as compared with the first semiconductor chip. Further, the second semiconductor chip can be cooled indirectly through the first semiconductor chip. This achieves simplification of the element cooling mechanism. With the simplified element cooling mechanism, the aspect of the present invention can achieve reductions in the size, weight and cost of the semiconductor device. Besides, the aspect of the present invention can reduce the size of the second semiconductor chip by using a wide gap semiconductor chip as the second semiconductor chip, thereby further reducing the size of the semiconductor device.

According to another aspect of the present invention, the semiconductor device includes a heat sink, an insulating substrate, a conductive plate, a first semiconductor chip, a metal base, a second semiconductor chip and a container. The heat sink has a bottom surface exposed to the outside and an upper surface opposed to the bottom surface. The insulating substrate is jointed to the upper surface of the heat sink, and the conductive plate is jointed to an upper surface of the insulating substrate. The first semiconductor chip has a first main electrode electrically connected through a first conductive layer to a first surface portion of an upper surface of the conductive plate, and a second main electrode opposed to the first main electrode with respect to a first direction which is equivalent to a direction of a normal to the upper surface of the conductive plate. The metal base includes a first portion and a second portion. The first portion has a first end which is electrically connected through a second conductive layer to a second surface portion of the upper surface of the conductive plate adjacent to the first surface portion, and extending from the first end to a second end in the first direction, and the second portion is coupled to the second end of the first portion and extends in a second direction orthogonal to the first direction so as to form an L-shape with the first portion. The second semiconductor chip has a first main electrode electrically connected through a third conductive layer to an upper surface of the second portion of the metal base, and a second main electrode opposed to the first main electrode with respect to the first direction. The container encloses the heat sink except an exposed portion of the bottom surface, the insulating substrate, the conductive plate, the first semiconductor chip, the metal base and the second semiconductor chip in its interior space. A lower surface of the second portion of the metal base is above the level of an upper surface of the second main electrode of the first semiconductor chip, and a base material of the second semiconductor chip is a wide gap semiconductor having a greater interband energy gap than silicon.

By the use of the metal base, the second semiconductor chip can, without decline of its capabilities, be placed in an upper position where a silicon semiconductor chip cannot be placed for reasons of the design of heat dissipation. Also, through the metal base, the second semiconductor chip can be cooled indirectly by an element cooling mechanism formed of the heat sink, the insulating substrate and the conductive plate. This achieves simplification of the element cooling mechanism. With the simplified element cooling mechanism, the aspect of the present invention can achieve reductions in the size, weight and cost of the semiconductor device. Besides, the aspect of the present invention can reduce the size of the second semiconductor chip by using a wide gap semiconductor chip as the second semiconductor chip, thereby further reducing the size of the semiconductor device. Further, since the second semiconductor chip is located above the first semiconductor chip, the aspect of the present invention has the effect of not limiting the size of the second semiconductor chip by that of the first semiconductor chip.

According to still another aspect of the present invention, the semiconductor device includes a first conductive base, a first metal base, a first semiconductor chip, a second metal base, a second semiconductor chip, a third metal base, an insulating substrate, a second conductive base, a first interconnection, a second interconnection and a container. The first conductive base has a bottom surface exposed to the outside and an upper surface opposed to the bottom surface. The first metal base has a lower surface on the upper surface of the first conductive base and an upper surface opposed to the lower surface. The first semiconductor chip has a first main electrode located on the upper surface of the first metal base and a second main electrode opposed to the first main electrode. The second metal base has a lower surface on the second main electrode of the first semiconductor chip and an upper surface opposed to the lower surface. The second semiconductor chip has a first main electrode located on the upper surface of the second metal base and a second main electrode opposed to the first main electrode. The third metal base has a lower surface on the second main electrode of the second semiconductor chip and an upper surface opposed to the lower surface. The insulating substrate has a lower surface on the upper surface of the third metal base and an upper surface opposed to the lower surface. The second conductive base has a lower surface on the upper surface of the insulating substrate and an upper surface opposed to the lower surface and exposed to the outside. The first interconnection electrically connects the first metal base and the third metal base, and the second interconnection electrically connects the second metal base and the second conductive base. The container encloses the first conductive base except an exposed portion of the bottom surface, the first metal base, the first semiconductor chip, the second metal base, the second semiconductor chip, the third metal base, the insulating substrate, the second conductive base except an exposed portion of the upper surface, the first interconnection and the second interconnection in its interior space. The bottom and upper surfaces of the first conductive base have larger areas than the first and second main electrodes of the first semiconductor chip, and the lower and upper surfaces of the second conductive base have larger areas than the first and second main electrodes of the second semiconductor chip. A base material of at least one of the first and second semiconductor chips is a wide gap semiconductor having a greater interband energy gap than silicon.

The first and second semiconductor chips are located face to face with the second metal base sandwiched in between and are also sandwiched between the first and second conductive bases with the first and third metal bases and the insulating substrate therebetween. This achieves simplification of the element cooling mechanism and reductions in the size, weight and cost of the semiconductor device itself. Besides, by the provision of the second metal base, the aspect of the present invention can achieve the effect of increasing heat capacity of the whole device. Also, the provision of the interconnection between the second metal base and the second conductive base establishes electrical continuity between the second conductive base, the upper surface of which is exposed to the outside, and both the second main electrode of the first semiconductor chip and the first main electrode of the second semiconductor chip. Further, according to the aspect of the present invention, the path of heat dissipation is secured for the individual first and second semiconductor chips, which brings about the effect of increasing the efficiency of heat dissipation. Furthermore, the use of a wide gap semiconductor chip as at least one of the semiconductor chips achieves the effect of reducing the size of that semiconductor chip, thereby contributing to reductions in the size of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a longitudinal cross-sectional view illustrating the configuration of a module element according to a third preferred embodiment of the present invention;

DESCRIPTION OF THE PREFERRED EMBODIMENTS

A wide gap semiconductor of, for example, silicon carbide or gallium nitride is receiving attention as a base material for semiconductor chips, as an alternative to silicon. Its advantages are the following.

First of all, a wide gap semiconductor such as silicon carbide or gallium nitride has a great interband energy gap and thus has high thermal stability, as compared with silicon. That is, a device manufactured by using silicon carbide or gallium nitride as the base material is capable of operation even at a high temperature of 1000 Kelvin. By utilizing this feature of being operable at high temperatures, more specifically, by locating a semiconductor chip of wide gap semiconductor such as silicon carbide or gallium nitride (wide gap semiconductor chip) in a portion of a closed container where the cooling effect is relatively small, a higher density of device configuration and accordingly a simpler element cooling mechanism, e.g., a heat sink, can be expected.

Secondly, since silicon carbide or gallium nitride has a breakdown electric field about 10 times as high as that of silicon, the wide gap semiconductor chip, when compared to a silicon device, can set the width of a depletion layer required for a certain voltage suppression capability extremely small. Accordingly, a distance between the cathode and anode electrodes can be reduced as compared with that for silicon, which consequently reduces a voltage drop roughly proportional to the distance between the electrodes, during current conduction. In other words, the wide gap semiconductor chip can reduce steady-state loss occurring during current conduction (the chip itself can be reduced in size). This effect brings the advantage that a diode and/or a switching device using silicon carbide or gallium nitride can considerably improve (or can be expected to improve) a trade-off between switching loss and steady-state loss, as compared with a diode and/or a switching device using silicon.

To achieve the above advantages of the wide gap semiconductor chip, the present invention adopts either (A) a configuration in which the wide gap semiconductor chip is located directly on another semiconductor chip (first and third preferred embodiments) or (B) a configuration in which the wide gap semiconductor chip is located above the plane in which another semiconductor chip is located (second preferred embodiment). This makes it possible to make full use of the capabilities of the wide gap semiconductor chip, even if the chip is cooled by a smaller and lighter cooling mechanism than that used for cooling a silicon chip. Hereinbelow, preferred embodiments of the present invention will be described in detail with reference to the accompanying drawings.

1. First Preferred Embodiment

Figure 1:
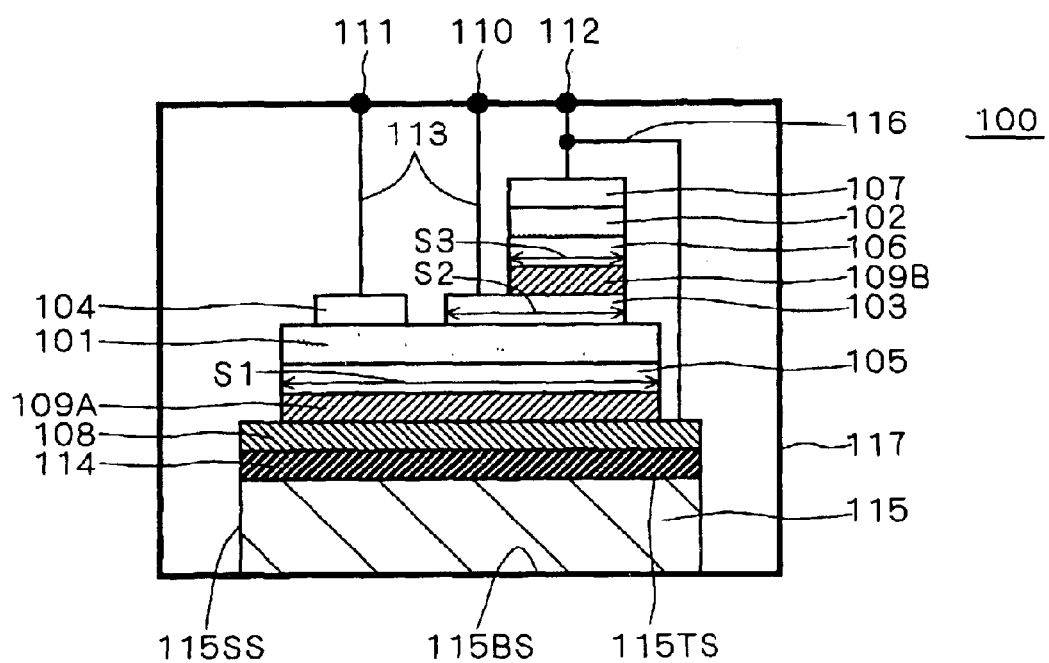
FIG. 1 is a longitudinal cross-sectional view illustrating the configuration of a module element according to a first preferred embodiment of the present invention.

FIG. 1 is a longitudinal cross-sectional view illustrating the configuration of a semiconductor device or module element 100 according to this preferred embodiment. FIG. 1 shows a configuration in which a semiconductor switching chip (hereinafter referred to simply as a "switching chip") or first semiconductor chip 101 which is formed by using silicon as the base material, and a diode chip or second semiconductor chip 102 which is formed by using a wide gap semiconductor having a greater interband energy gap than silicon as the base material are arranged in a closed container 117.

In FIG. 1, a heat sink 115 having cooling capability has a bottom surface 115BS exposed to the outside except the edge, an upper surface 115TS opposed to the bottom surface 115BS, and a side surface 115SS sandwiched between the surfaces 115BS and 115TS. On the upper surface 115TS of the heat sink 115, an insulating substrate 114 is bonded with an adhesive (not shown). Here, the upper surface 115TS and the lower surface of the insulating substrate 114 are equal in area. On the upper surface of the insulating substrate 114, a conductive plate 108 is bonded with an adhesive (not shown). Here again, the upper surface 115TS, the upper surface of the insulating substrate 114 and the lower surface of the conductive plate 108 are equal in area.

The switching chip 101 has an anode electrode or first main electrode 105 formed on the rear surface, and a cathode electrode or second main electrode 103 and a control electrode 104 formed on the front surface. The cathode electrode 103 is opposed to and has a smaller area than the anode electrode 105 (S1>S2). The anode electrode 105 of the switching chip 101 is electrically connected through a first conductive layer 109A of solder or brazing material to the upper surface of the conductive plate 108. The control electrode 104 is connected by a bonding wire 113 to a control conducting bar 111 formed on the closed container 117, and the cathode electrode 103 is connected by another bonding wire 113 to a cathode conducting bar 110 formed on the closed container 117.

The diode chip 102 has an anode electrode or first main electrode 106 formed on the rear surface and a cathode electrode or second main electrode 107 formed on the front surface. The anode electrode 106 has a smaller area than the cathode electrode 103 of the switching chip 101 (S2>S3), and the cathode electrode 107 opposed to the anode electrode 106 is equal in area to the anode electrode 106. The anode electrode 106 of the diode chip 102 is electrically connected through a second conductive layer 109B of solder or brazing material to the upper surface of the cathode electrode 103 of the switching chip 101. The cathode electrode 107 of the diode chip 102 is electrically connected by a bonding wire 116 to an anode conducting bar 112 formed on the closed container 117, and the upper surface of the conductive plate 108 is also electrically connected to the anode conducting bar 112 by the bonding wire 116.

The closed container 117 encloses the whole heat sink 115 except the exposed portion of the bottom surface 115BS, the whole insulating substrate 114, the whole conductive plate 108, the whole switching chip 101 and the whole diode chip 102 in the interior space. The space above the cathode electrode 107 of the diode chip 102 corresponds to the interior space of the closed container 117.

In the above configuration, first heat generated by the energy loss of the switching chip 101 is transferred through the rear anode electrode 105 and the first conductive layer 109A and directly through an element cooling mechanism or path formed of the conductive plate 108, the insulating substrate 114 and the heat sink 115, and then dissipated from the exposed portion of the bottom surface 115BS to the outside.

On the other hand, second heat generated by the energy loss of the diode chip 102 is transferred once into the switching chip 101 through the rear anode electrode 106 and the second conductive layer 109B and then into the above element cooling mechanism (108, 114, 115) together with the above first heat generated by the switching chip 101, and then dissipated to the outside.

In this fashion, the diode chip 102 is indirectly cooled by the above element cooling mechanism (108, 114, 115) through the switching chip 101. The operating temperature of the diode chip 102 is thus higher than that of the switching chip 101; however, the diode chip 102, which is formed by using a wide gap semiconductor as the base material, can normally operate even at high temperatures without any problems. More specifically, a critical operating temperature of an ordinary silicon semiconductor chip is approximately 150° C., but a wide gap semiconductor chip can operate at temperatures up to 500 to 600° C. in theory.

As above described, according to this preferred embodiment, while the switching chip 101 of silicon can be cooled directly by the above element cooling mechanism (108, 114, 115), the diode chip 102 of wide gap semiconductor needs only to be cooled indirectly. This makes it possible to make full use of the capabilities of the module element 100 with the use of a smaller size cooling system than that used in the conventional technique shown in FIG. 9. That is, simplification of the element cooling mechanism can be achieved.

Figure 9:
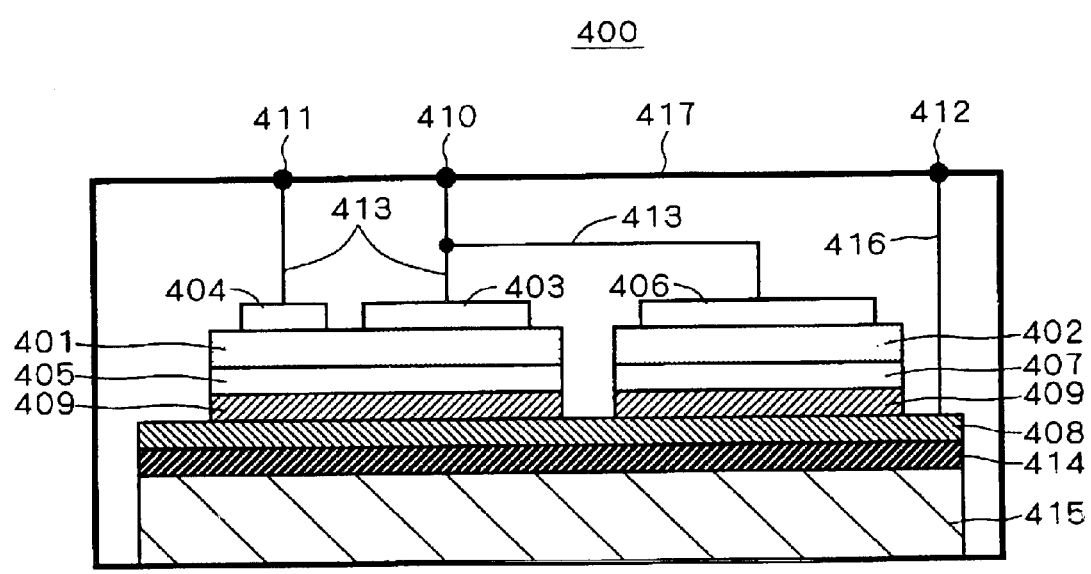
FIG. 9 is a longitudinal cross-sectional view illustrating the configuration of a module element according to a conventional technique.

Besides, (i) the element cooling mechanism (108, 114, 115) of FIG. 1 is small in size and light in weight as compared with the element cooling mechanism (408, 414, 415) of FIG. 9, and (ii) the diode chip 102 of FIG. 1 is also smaller and lighter than the diode chip 402 of FIG. 9. These features (i) and (ii) can achieve reductions in the size, weight and cost of the module element 100. More specifically, the module element 100 of FIG. 1 can be reduced in size to about two-thirds the size of the module element 400 shown in FIG. 9. Since the actual thicknesses of the respective components 103 to 107, 109A and 109B are so thin as to be negligible as compared to that of the conductive plate 108 (they are about several tens of times smaller than that of the conductive plate 108), although the chips 101 and 102 are stacked one above the other in two layers as shown in FIG. 1, the total of the heights of the chips 101 and 102 is not so different from the height of each of the chips 401 and 402 of FIG. 9.

Figure 5:
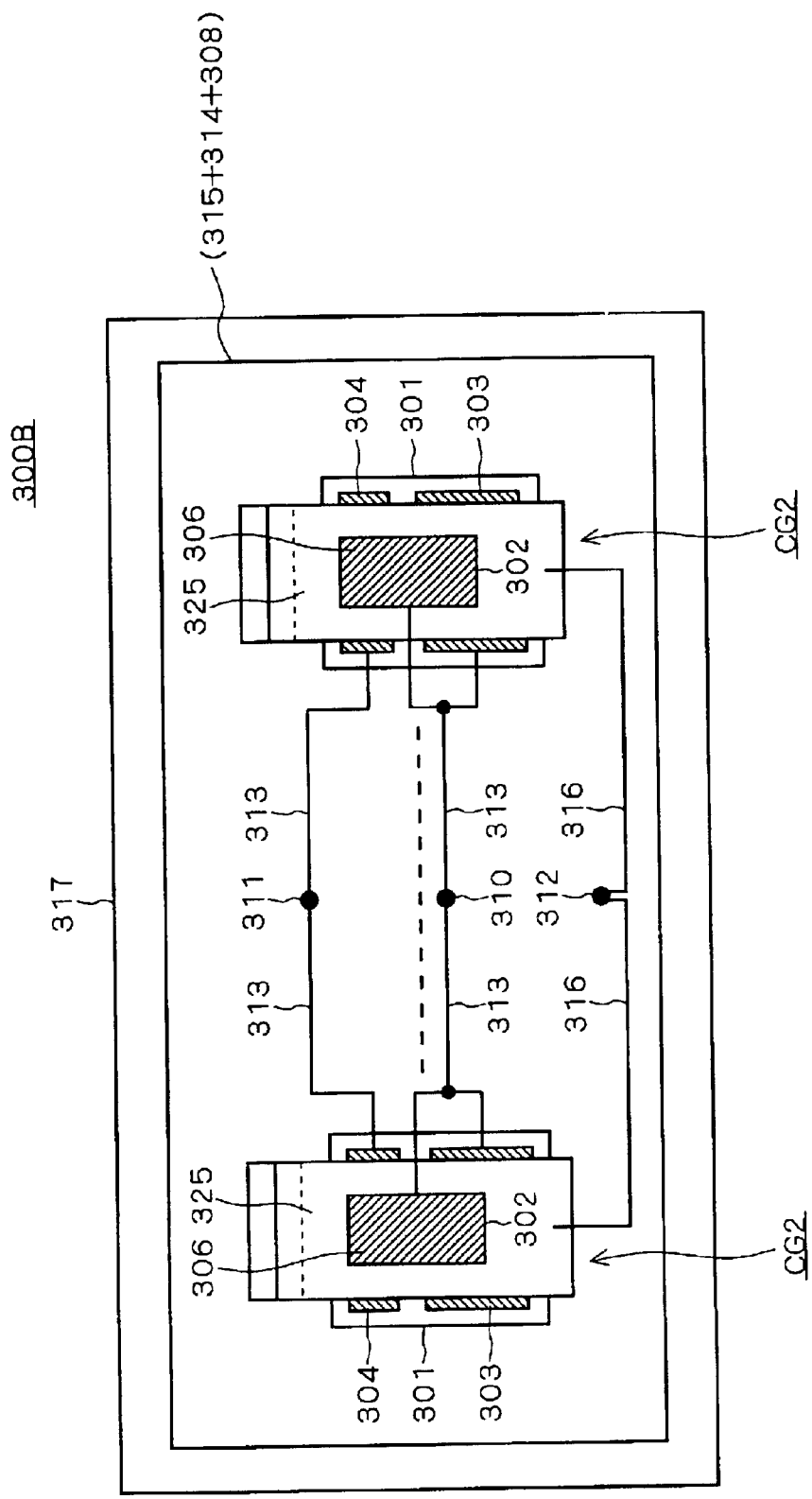
FIG. 5 is a perspective plan view illustrating in schematic form the configuration of a module element according to a second modification of the second preferred embodiment.

Japanese Patent Application Laid-open No. 11-274482, FIG. 5, proposes a configuration wherein an SiC diode chip and Si switching chips are arranged lengthways through a conductive plate in terms of further improvements in isolation between adjacent chips. In the configuration of FIG. 5 in the above patent application and a description thereof, the provision of a cooling mechanism for use in dissipating heat generated by each chip to the outside is neither disclosed nor suggested, but if such a cooling mechanism is provided in this configuration, a heat sink or the like will be provided so as to be in contact with an exposed outer surface of a conductive plate connected to the outermost SiC diode chip of the plurality of longitudinally arranged chips. With such a configuration, however, the SiC diode chip is directly cooled by the heat sink or the like through the exposed conductive plate, in which case the advantage of the wide gap semiconductor chip being capable of operation at high temperatures is not used at all and accordingly reductions in the size and weight of the module element through the use of this capability can hardly be expected. In this respect, the module element 100 according to this preferred embodiment illustrated in FIG. 1 can provide a semiconductor device of much more practical use than the configuration of FIG. 5 in the above patent application.

Further, in the configuration of FIG. 5 in the above patent application, the SiC diode chip and the adjacent Si switching chip, which are equal in area, are covered with an insulating structure and thereby brought into contact with the conductive plate provided therebetween. Thus, even if the SiC diode chip of FIG. 5 in the above patent application is combined with the previously-described module element of FIG. 9, a resultant module element is widely different in configuration from the module element according to this preferred embodiment.

By the way, the switching chip 101 may also be formed by using the above wide gap semiconductor as the base material. This achieves reductions in the size and weight of the switching chip 101, thereby contributing to further reductions in the size and weight of the whole module element 100.

1-1. Modification

Figure 2:
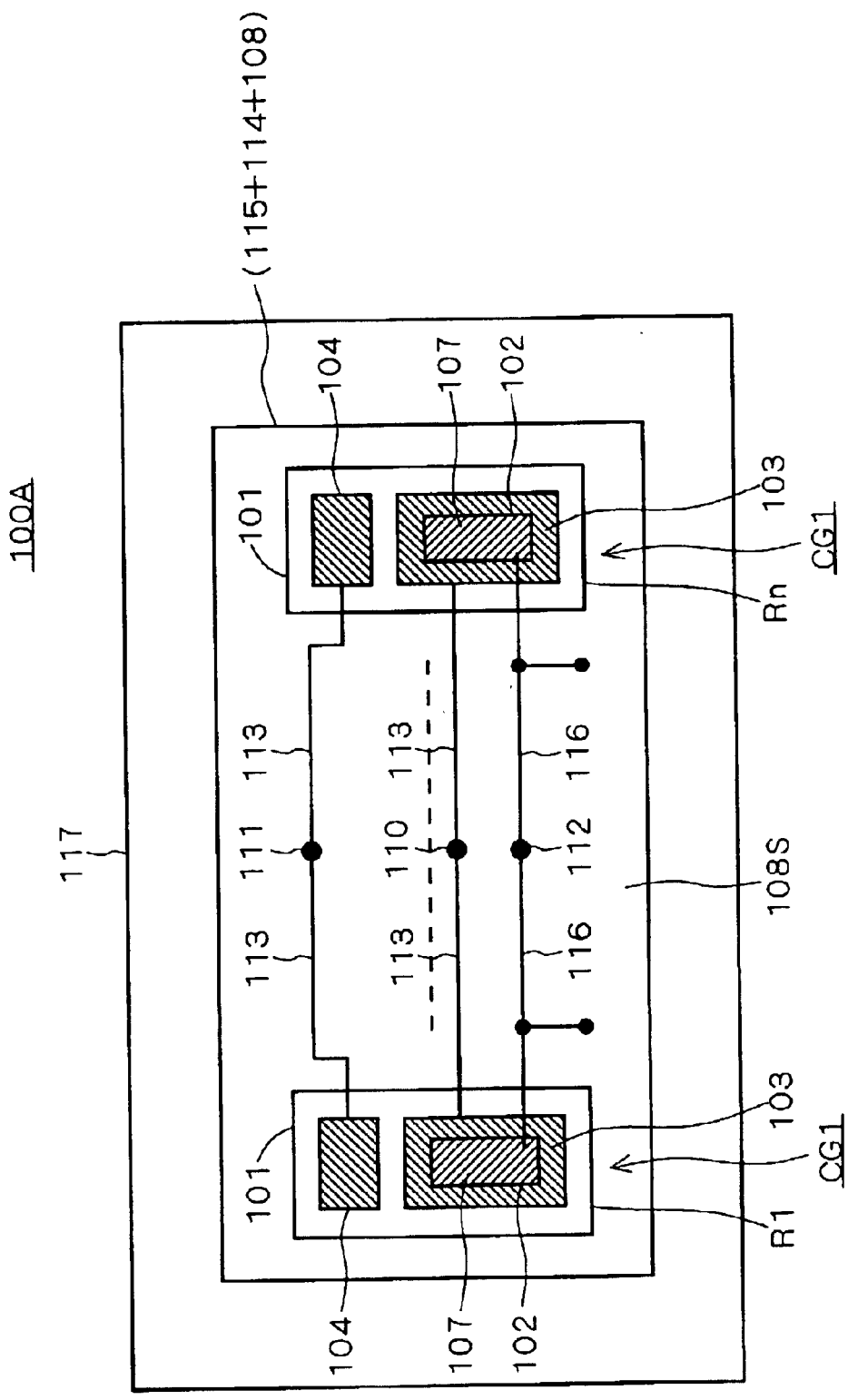
FIG. 2 is a perspective plan view illustrating in schematic form the configuration of a module element according to a modification of the first preferred embodiment.

FIG. 2 is a perspective top view illustrating in schematic form the configuration of a module element 100A according to a modification of the first preferred embodiment. As shown in FIG. 2, the first semiconductor chip 101 is located on a first region R1 of the upper surface 108S of the conductive plate 108 in the element cooling mechanism (115+114+108) and the second semiconductor chip 102 is located on the second main electrode 103 as shown FIG. 1. Similarly, the first and second semiconductor chips 101 and 102 are also located as shown in FIG. 1 on each region (e.g., a region Rn) of the upper surface 108S other than the first region R1.

In this way, according to this modification, a plurality of semiconductor chip groups CG1, each including a pair of the first semiconductor chip 101 and the second semiconductor chip 102 on the second main electrode of the first semiconductor chip 101, are located on the common element cooling mechanism (115+114+108) and share the control conducting bar 111, the cathode conducting bar 110 and the anode conducting bar 112. That is, the plurality of semiconductor chip groups CG1 are connected in parallel between the anode conducting bar 112 and the cathode conducting bar 110.

This modification therefore has the advantage of allowing the flow of larger current than would be possible with only a single pair of chips as shown in FIG. 1.

2. Second Preferred Embodiment

Figure 3:
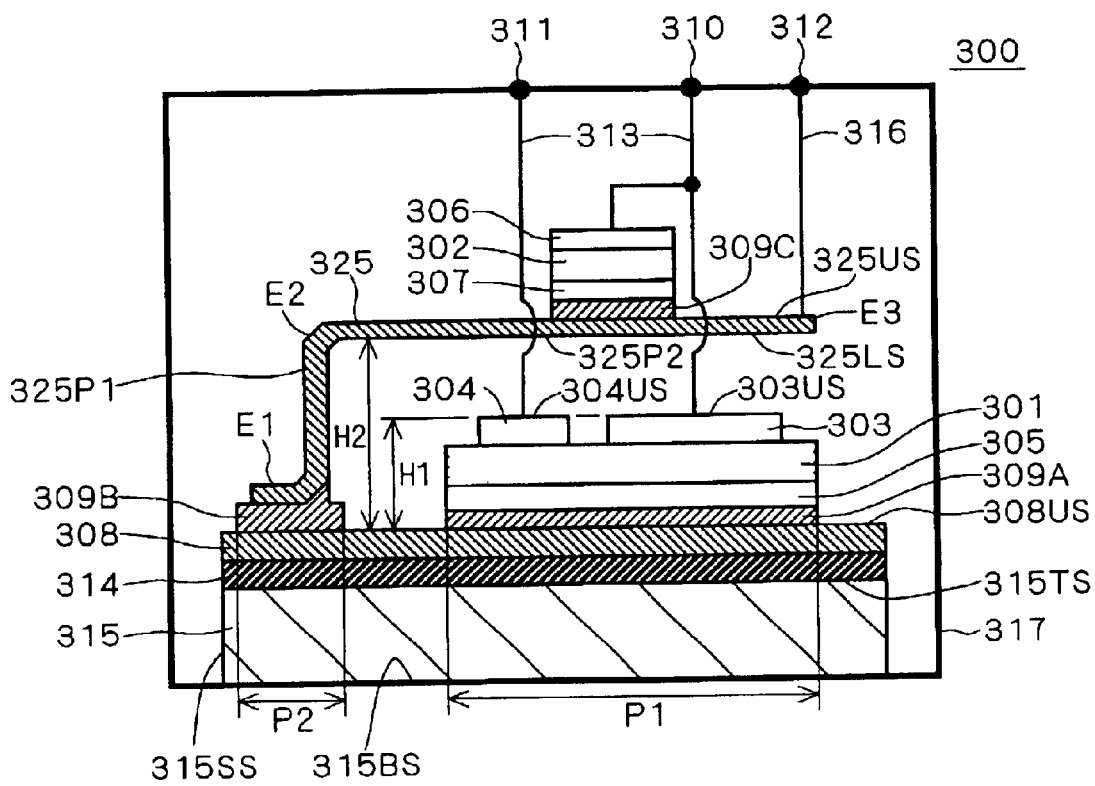
FIG. 3 is a longitudinal cross-sectional view illustrating the configuration of a module element according to a second preferred embodiment of the present invention.

FIG. 3 is a longitudinal cross-sectional view illustrating the configuration of a module element 300 according to this preferred embodiment. The module element 300 is characterized in that (1) in the interior space of a closed container 317, a second semiconductor chip using a wide gap semiconductor as the base material is located above a first semiconductor chip located on an element cooling mechanism, and (2) one end of an L-shaped metal base which supports the second semiconductor chip is bonded to the element cooling mechanism so that the metal base can also be used as a path for use in dissipating heat generated by the second semiconductor chip. Hereinbelow, the detail of the configuration will be described with reference to FIG. 3.

The element cooling mechanism of the module element 300 is formed of a heat sink 315, an insulating substrate 314 and a conductive plate 308. The heat sink 315 forming the major part of the cooling mechanism has a flat bottom surface 315BS exposed to the outside except the edge, a flat upper surface 315TS opposed to the bottom surface 315BS with respect to a first direction D1, and a side surface 315SS sandwiched between the surfaces 315BS and 315TS and extending in the first direction D1. The insulating substrate 314 is bonded onto the upper surface 315TS of the heat sink 315 with an adhesive (not shown). Further, the conductive plate 308 is bonded onto the upper surface of the insulating substrate 314 with an adhesive (not shown). Here, the first direction D1 corresponds to a direction of the normal to the upper surface of the element cooling mechanism, i.e., an upper surface 308US of the conductive plate 308.

A first surface portion P1 of the upper surface 308U of the conductive plate 308, which accounts for almost the central portion, is electrically connected through a first conductive layer 309A of solder or brazing material to a first main electrode or anode electrode 305 formed across the lower surface of a first semiconductor chip 301. The first semiconductor chip 301 employed herein is a switching chip (such as an IGBT or MOSFET) using silicon as the base material. The first semiconductor chip 301 has on the upper surface a second main electrode or cathode electrode 303 and a control electrode 304 which are opposed to the first main electrode 305 with respect to the first direction D1. The second main electrode 303 and the control electrode 304 both have a smaller area than the first semiconductor chip 301. The height of the upper surface of each of both the electrodes 303 and 304 above the upper surface 308US is represented by H1 in FIG. 3. The second main electrode 303 is connected by a bonding wire 313 to a cathode conducting bar 310 formed on the upper surface of the closed container 317, and the control electrode 304 is connected by another bonding wire 313 to a control conducting bar 311.

A second surface region P2 of the upper surface 308U of the conductive plate 308, which is located near the outer peripheral edge and adjacent to the first surface portion P1 with respect to a second direction D2, is electrically connected through a second conductive layer 309B of solder or brazing material to a first end E1 of a first portion 325P1 of a metal base 325. The first portion 325P1 extends from the first end E1 to its second end E2 in the first direction D1. That is, the first portion 325P1 except the first end E1 has surfaces extending both in the lengthwise direction D1 and in a widthwise direction D3 and has a thickness along the second direction D2. The metal base 325 further has a second portion 325P2 coupled to the first portion 325P1. More specifically, the second portion 325P2 has one end coupled to the second end E2 of the first portion 325P1 and the other end E3 to which it extends from the above one end in the second direction D2 orthogonal to the first direction D1. In other words, the second portion 325P2 has surfaces 325LS and 325US extending both in the lengthwise direction D2 and in the widthwise direction D3 and has a thickness along the first direction D1. The metal base 325 is thus of generally L-like cross section in a plane D1–D2. Further, the lower surface 325LS of the second portion 325P2 of the metal base 325 is above the level of both an upper surface 303US of the second main electrode 303 and an upper surface 304US of the control electrode 304 of the first semiconductor chip 301. That is, a height H2 of the lower surface 325LS above the upper surface 308US is greater than the height H1 of the second main electrode 303. The upper surface 325US in the vicinity of the other end E3 is electrically connected by a bonding wire 316 to an anode conducting bar 312.

Further, generally a central region of the upper surface 325US of the second portion 325P2 of the metal base 325 is electrically connected through a third conductive layer 309C of solder or brazing material to a first main electrode or cathode electrode 307 of a second semiconductor chip 302. The second semiconductor chip 302 employed herein is a diode chip using as the base material a wide gap semiconductor having a greater interband energy gap than silicon. The second semiconductor chip 302 has a second main electrode or anode electrode 306 opposed to the first main electrode 307 with respect to the first direction D1. This second main electrode 306 is connected by the bonding wire 313 to the cathode conducting bar 310.

The closed container 317 encloses the whole heat sink 315 except the exposed portion of the bottom surface 315BS, the whole insulating substrate 314, the whole conductive plate 308, the whole first semiconductor chip 301, the whole metal base 325 and the whole second semiconductor chip 302 in the interior space.

In the above configuration, heat generated by the energy loss of the first semiconductor chip 301 can be cooled directly by the element cooling mechanism (315+314+308) through the first conductive layer 309A. On the other hand, heat generated by the energy loss of the second semiconductor chip 302 is once transferred through the third conductive layer 309C into the metal base 325 and then through the second conductive layer 309B into the element cooling mechanism (315+314+308), and then dissipated from the exposed portion of the bottom surface 315BS to the outside.

In this fashion, by the presence of the metal base 325 as an intermediate path of heat dissipation, heat generated by the second semiconductor chip 302 can be cooled indirectly by the element cooling mechanism (315+314+308). In other words, the second semiconductor chip 302 is located in the upper part which is farther from the heat sink 315 and is thus hard to cool (in a position where a silicon chip cannot be placed for reasons of the design of heat dissipation), as compared with the first semiconductor chip 301. The operating temperature of the second semiconductor chip 302 is thus higher than that of the first semiconductor chip 301; however, the second semiconductor chip 302, which is formed by using a wide gap semiconductor as the base material, can operate properly even under such high temperature conditions as in the first preferred embodiment.

As above described, according to this preferred embodiment, the second semiconductor chip 302 is located on the metal base 325 by taking advantage of the fact that the second semiconductor chip 302 is a wide gap semiconductor chip. This achieves simplification of and reductions in the size and weight of the element cooling mechanism (315+314+308) by the amount of space occupied by the diode, as compared with the conventional technique illustrated in FIG. 9, and further achieves reductions in the size and weight of the second semiconductor chip 302 itself, thereby achieving reductions in the size, weight and cost of the module element 300. More specifically, the module element 300 of FIG. 3 can be reduced in size to about two-thirds the size of the module element 400 shown in FIG. 9. Further, by optimizing the shapes and sizes of the respective conducting bars 310 to 312 and the metal base 325, the thickness of the module element 300 can also be reduced to about the same level as that of the module element 400 of FIG. 9.

Besides, this preferred embodiment brings the advantage of not limiting the size of the second semiconductor chip 302 by that of the first semiconductor chip 301. In this respect, in the first preferred embodiment (FIG. 1) in which the second semiconductor chip 102 is located on the cathode electrode 103 of the first semiconductor chip 101, the size of the second semiconductor chip 102 is necessarily limited by that of the cathode electrode 103 of the first semiconductor chip 101.

Here, Japanese Patent Application No. 11-274482, FIG. 6, proposes a configuration in which, in terms of further reductions in loss by reducing the lengths of interconnections between chips, a plurality of switching element chips are located in the lower part with each chip being connected by the interconnections to the others, and an SiC diode chip is located above those switching element chips so that its respective electrode is connected by the interconnection to an electrode of a corresponding lower switching element chip. However, in FIG. 6 in the above patent application and a description thereof, neither the idea that heat generated by the upper SiC diode chip should be dissipated to the outside nor a configuration for implementing that idea has been suggested.

By the way, the first semiconductor chip 301 may also be formed by using the aforementioned wide gap semiconductor as the base material. This achieves reductions in the size and weight of the first semiconductor chip 301, thereby contributing to further reductions in the size and weight of the whole module element 300.

Further, the metal base 325 may have a plurality of diode chips located thereon.

2-1. First Modification

Figure 4:
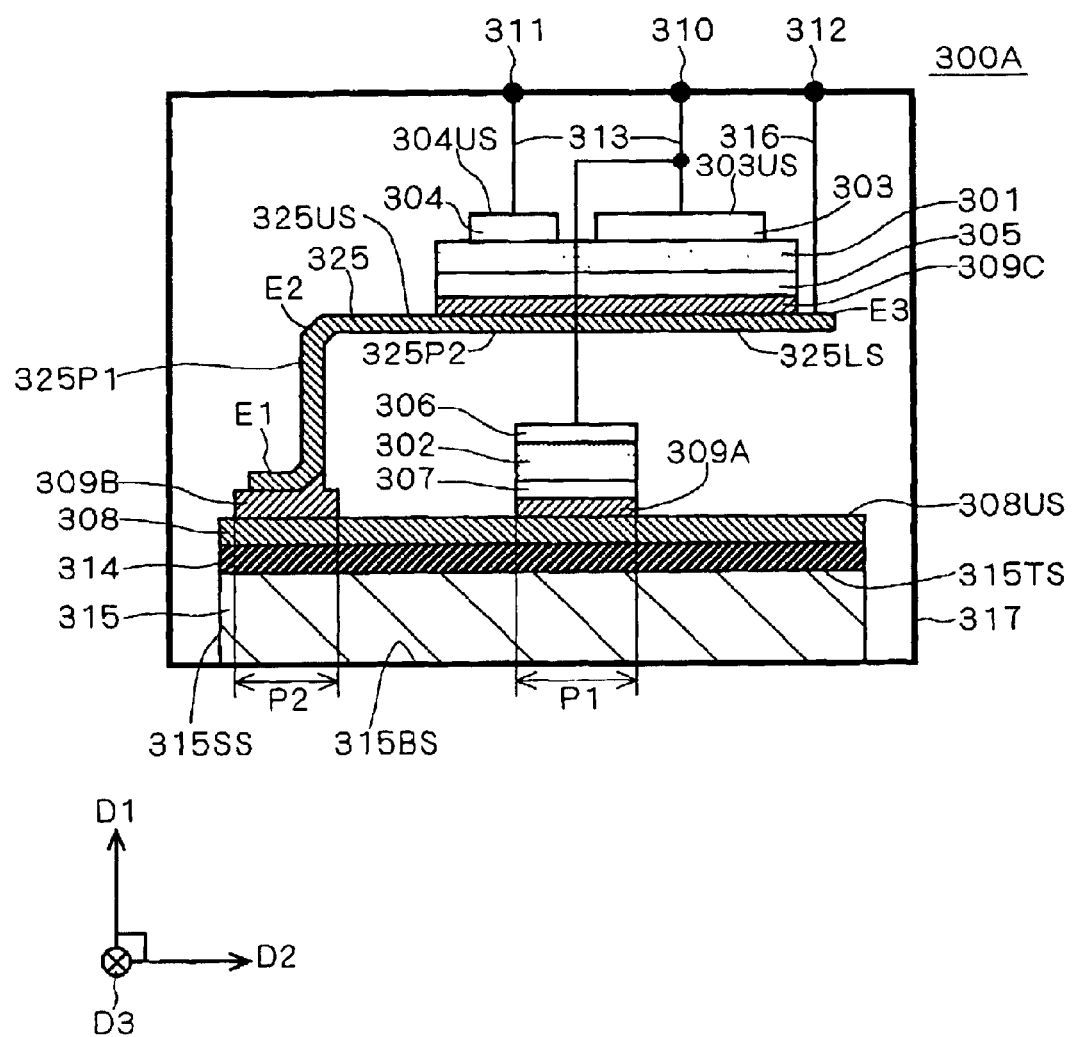
FIG. 4 is a longitudinal cross-sectional view illustrating the configuration of a module element according to a first modification of the second preferred embodiment.

FIG. 4 is a longitudinal cross-sectional view illustrating the configuration of a module element 300A according to a first modification of the second preferred embodiment. In this modification, the second semiconductor chip 301 formed by using a wide gap semiconductor as the base material and located on the metal base 325 is a switching chip, and the first and second main electrodes thereof correspond respectively to the anode electrode 305 and the cathode electrode 303. On the other hand, the first semiconductor chip 302 located on the conductive plate 308 through the first conductive layer 309A is a diode chip formed by using silicon or wide gap semiconductor as the base material, and the first and second main electrodes thereof correspond respectively to the cathode electrode 307 and the anode electrode 306. This modification can also achieve the same function and effect as achieved by the second preferred embodiment.

In this modification, also, the metal base 325 may have a plurality of switching chips located thereon.

2-2. Second Modification

FIG. 5 is a perspective top view illustrating in schematic form the configuration of a module element 300B according to a second modification of the second preferred embodiment. As shown in FIG. 5, a plurality of semiconductor chip groups CG2, each including a pair of the first semiconductor chip 301 and the second semiconductor chip 302 on the metal base 325, are located on a single (common) element cooling mechanism (315+314+308). The semiconductor chip groups CG2 share the conducting bars 311, 310 and 312. That is, the plurality of semiconductor chip groups CG2 are connected in parallel between the anode conducting bar 312 and the cathode conducting bar 310.

It is also possible to apply the first modification shown in FIG. 4 to this modification in a similar fashion.

This modification brings the advantage of allowing the flow of larger current than would be possible with only a single pair of chips as shown in FIG. 3 or 4.

3. Third Preferred Embodiment

FIG. 6 is a longitudinal cross-sectional view illustrating the configuration of a pressure contact type module element (semiconductor device) 200 according to this preferred embodiment. FIG. 6 shows an example of a configuration in which a switching chip 201 (corresponding to a first semiconductor chip) and a diode chip 202 (corresponding to a second semiconductor chip), both of which are formed by using a wide gap semiconductor as the base material, are placed in a closed container 217 by external pressure.

The switching chip 201 has a cathode electrode (second main electrode) 203 and a control electrode 204 formed on the front surface, and an anode electrode (first main electrode) 205 formed on the rear surface. Of these electrodes, the control electrode 204 is connected by a bonding wire or third interconnection 225 to a control conducting bar 211 provided in the closed container 217. The diode chip 202 has a cathode electrode (second main electrode) 207 formed on the front surface and an anode electrode (first main electrode) 206 formed on the rear surface.

A first conductive base (of, for example, metal) 223 having the capability of dissipating heat to the outside has a bottom surface 223BS exposed to the outside except the edge, an upper surface 223US opposed to the bottom surface 223BS with respect to a direction of the application of load (hereinafter referred to as a "load application direction") 224, and a side surface 223SS sandwiched between the surfaces 223BS and 223US. Here, the load application direction 224 corresponds to a direction of the normal to the bottom surface 223BS and an upper surface 222US later to be described. The bottom surface 223BS is electrically connected to an external anode conducting bar 212.

A first metal base 220 has a lower surface, an upper surface 220US opposed to the lower surface with respect to the load application direction 224, and a side surface. The lower surface of the first metal base 220 provides absolute electrical continuity between itself and the upper surface 223US of the first conductive base 223 by being brought into absolute mechanical contact with the upper surface 223US by the user's application of external load (or pressure) during actual use of the device 200 (i.e., pressure contact).

The anode electrode 205 of the switching chip 201 is located on the upper surface 220US of the first metal base 220, and during actual use of the device 200, is brought into absolute mechanical contact with the upper surface 220US by the aforementioned application of load (or pressure) (i.e., pressure contact), thereby providing absolute electrical continuity between itself and the upper surface 220US. Here, the upper and lower surfaces of the anode electrode 205 which are planes orthogonal to the load application direction 224 have a smaller area than the bottom and upper surfaces 223BS and 223US of the first conductive base 223, and so are the upper and lower surfaces of the cathode electrode 203. That is, the switching chip 201 has a smaller area than the first conductive base 223 (S1>S2).

The lower surface of a second metal base 219 is on the cathode electrode 203 of the switching chip 201, and during actual use of the device 200, is brought into absolute mechanical contact with the cathode electrode 203 by the aforementioned application of load (or pressure) (i.e., pressure contact). That is, the second metal base 219 provides absolute electrical continuity between itself and the cathode electrode 203 by pressure contact with the electrode 203.

The anode electrode 206 of the diode chip 202 is located on the upper surface of the second metal base 219 except a projection 219PP, and during actual use of the device 200, is brought into mechanical contact with the above upper surface of the second metal base 219 by the aforementioned application of load (or pressure) (i.e., pressure contact), thereby providing electrical continuity between itself and the metal base 219. In other words, the anode electrode 206 is located on the upper surface of the second metal base 219 to provide absolute electrical continuity between itself and the second metal base 219 by pressure contact with the second metal base 219.

As above described, the cathode electrode 203 of the switching chip 201 and the anode electrode 206 of the diode chip 202, when in pressure contact with each other, are electrically connected to each other through the second metal base 219 therebetween.

The lower surface of a third metal base 218 is on the cathode electrode 207 of the diode chip 202, and during actual use of the device 200, is brought into absolute mechanical contact with the cathode electrode 207 by the aforementioned application of load (or pressure) (i.e., pressure contact), thereby providing absolute electrical continuity between itself and the cathode electrode 207. The side surface of the third metal base 218 is electrically connected by a first interconnection 216 such as a bonding wire to the upper surface 220US of the first metal base 220.

The lower surface of an insulating substrate 221 is on the upper surface of the third metal base 218, and during actual use of the device 200, is brought into absolute mechanical contact with the upper surface of the third metal base 218 by the aforementioned application of load (or pressure) (i.e., pressure contact).

A lower surface 222LS of a second conductive base (of, for example, metal) 222 having the capability of dissipating heat to the outside is on the upper surface of the insulating substrate 221, and during actual use of the device 200, is brought into absolute mechanical contact with the upper surface of the insulating substrate 221 by the aforementioned application of load (or pressure) (i.e., pressure contact). An upper surface 222US of the second conductive base 222, which is exposed to the outside except the edge, is connectable to an external cathode conducting bar 210, and the lower surface 222LS thereof is electrically connected by a second interconnection 213 such as a bonding wire to the projection 219PP of the second metal base 219. The lower and upper surfaces 222LS and 222US of the second conductive base 222 have a larger area than the anode and cathode electrodes 206 and 207 of the diode chip 202 (S4>S3).

The closed container 217 encloses the whole first conductive base 223 except the exposed portion of the bottom surface 223BS, the whole first metal base 220, the whole switching chip 201, the whole second metal base 219, the whole diode chip 202, the whole third metal base 218, the whole insulating substrate 221, the whole second conductive base 222 except the exposed portion of the upper surface 222US, the whole first interconnection 216, the whole second interconnection 213 and the whole third interconnection 225 in the interior space.

In the pressure contact type semiconductor device 200 of FIG. 6 without pressure contact after sealing, electrical or mechanical contact between opposing built-in parts is not in perfect condition. This is not to say that opposing built-in parts are in a perfect open condition; they have imperfect electrical or mechanical contact with each other by the presence of contact resistance therebetween.

To ensure perfect electrical or mechanical contact between opposing built-in parts, the user using the pressure contact type semiconductor device 200 needs to bring the respective parts of the device 200 into pressure contact with each other. In use of the device 200, therefore, the user applies external pressure on the second conductive base 222 and the first conductive base 223 in the load application direction as indicated by arrows 224. That is, the module element 200 is used with the application of load in the load application direction 224 as shown in FIG. 6. By the application of load, the parts 221, 218, 202, 219, 201 and 220 sandwiched between the conductive bases 222 and 223 are brought into pressure contact with and thereby completely mechanically secured to their respective opposing parts.

As above described, since in the module element 200 of FIG. 6, the main electrode of one chip device is in contact with the main electrode of the other chip device through the second metal base 219, the efficiency of heat dissipation is reduced by necessity as compared with a conventional pressure contact type module. More specifically, heat generated by the loss of the diode chip 202 is mainly dissipated through the cathode electrode 207, the third metal base 218, the insulating substrate 221 and the second conductive base 222 to the outside of the module. On the other hand, heat generated by the loss of the switching chip 201 is dissipated through the anode electrode 205, the first metal base or buffer plate 220 and the first conductive base 223 to the outside of the module. Accordingly, the operating temperature of each chip device becomes higher than in a conventional module.

In the case of a conventional pressure contact type module which employs as its active element only a semiconductor chip using silicon as the base material, a switching chip and a diode chip are arranged in parallel between a pair of opposing conductive bases and thus heat generated by the loss of each semiconductor chip can be dissipated from both electrode sides.

In the module element 200 of FIG. 6, however, the switching chip 201 and the diode chip 202 are both formed of a wide gap semiconductor chip being capable of operation at high temperatures (up to approximately 500 to 600° C. in theory). Thus, both the chips 201 and 202 can operate properly even under such high temperature conditions.

With the aforementioned configuration, this preferred embodiment provides the following advantages. (1) The non-use of a heat sink provides a small light-weight element cooling structure. (2) Since one chip is located face to face on the other chip, a pair of conductive bases which sandwich both the chips can be more satisfactorily reduced in size and weight than conventional ones (cf. the first and second conductive bases 223 and 222 of FIG. 6). Besides, the wide gap semiconductor chips 201 and 202 can also be reduced in size and weight as compared with conventional silicon semiconductor chips. This results in a small, light-weight and low-cost module element. (3) The provision of the second metal base 219 between the chips 201 and 202 increases the whole heat capacity. Further, the provision of the second interconnection 213 between the second metal base 219 and the second conductive base 222 establishes electrical continuity between the second conductive base 222, the upper surface of which is exposed to the outside, and the main electrodes of the chips 201 and 202. (4) Avoidance of wire bonding to the electrodes of the chips 201 and 202 eliminates the occurrence of electrical loss due to a bonding wire. (5) Absolute electric contact made by pressure contact avoids a problem such as the occurrence of molten solder at certain operating temperatures. This makes it possible to use the device 200 even under thermally severe conditions. (6) Since the path of heat dissipation is secured for the individual chips 201 and 202, the effect of improving the efficiency of heat dissipation can be expected.

When either one of the semiconductor chips 201 and 202 has large heat quantity, only the semiconductor chip with large heat quantity may be formed of a wide gap semiconductor chip (in this case, the other semiconductor chip is formed of a silicon semiconductor chip).

3-1. First Modification

Figure 7:
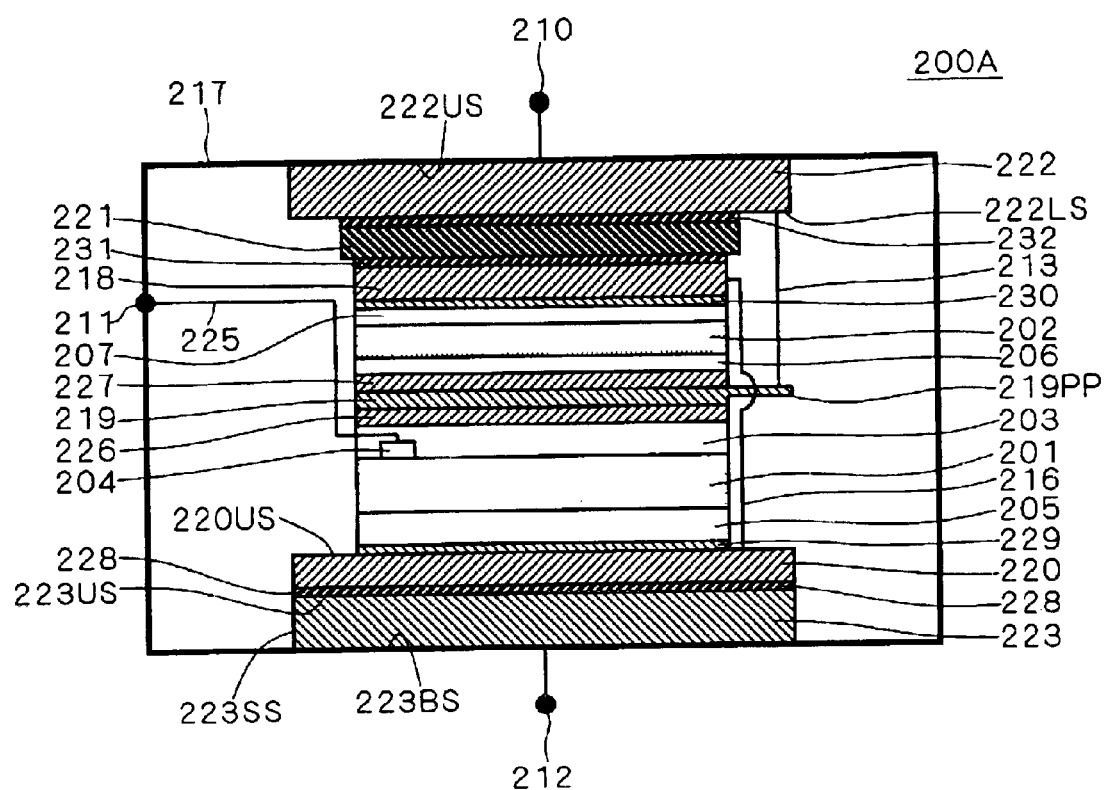
FIG. 7 is a longitudinal cross-sectional view illustrating the configuration of a module element according to a first modification of the third preferred embodiment.

FIG. 7 is a longitudinal cross-sectional view illustrating the configuration of a module element 200A according to a first modification of the third preferred embodiment, in which the same reference numerals as in FIG. 6 are used to indicate the same or similar components. This modification is characterized in that, in order to avoid the necessity for the user using the device 200A to make pressure contact in the device 200A, all the parts 223, 220, 201, 219, 202, 218, 221 and 222 contained in the closed container 217 are fully integrated by a conductive layer of solder or brazing material or by an adhesive of, for example, resin. More specifically, the module element 200A further includes (1) a bonding layer (formed of a conductive layer such as an adhesive or solder) 228 which mechanically joins the upper surface 223US of the first conductive base 223 and the lower surface of the first metal base 220 to each other; (2) a first conductive layer 229 which joins the upper surface 220US of the first metal base 220 and the first main electrode 205 of the first semiconductor chip 201 to provide electrical continuity therebetween; (3) a second conductive layer 226 which joins the second main electrode 203 of the first semiconductor chip 201 and the lower surface of the second metal base 219 to provide electrical continuity therebetween; (4) a third conductive layer 227 which joins the upper surface of the second metal base 219 and the first main electrode 206 of the second semiconductor chip 202 to provide electrical continuity therebetween; (5) a fourth conductive layer 230 which joins the second main electrode 207 of the second semiconductor chip 202 and the lower surface of the third metal base 218 to provide electrical continuity therebetween; (6) a first adhesive 231 which bonds the upper surface of the third metal base 218 and the lower surface of the insulating substrate 221; and (7) a second adhesive 232 which bonds the upper surface of the insulating substrate 221 and the lower surface 222LS of the second conductive base 222.

3-2. Second Modification

Figure 8:
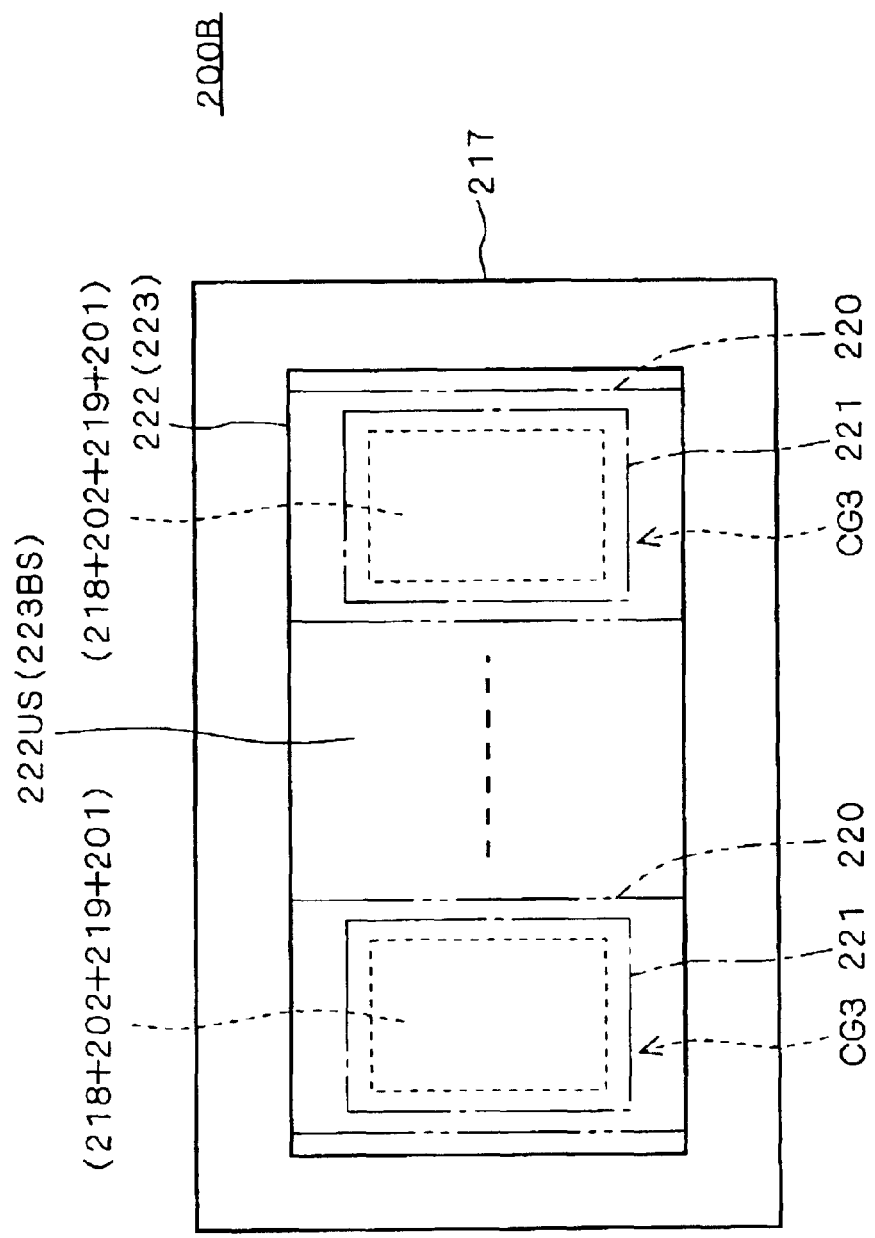
FIG. 8 is a perspective plan view illustrating in schematic form the configuration of a module element according to a second modification of the third preferred embodiment.

FIG. 8 is a perspective top view illustrating in schematic form the configuration of a module element 200B according to a second modification of the third preferred embodiment. This modification is characterized in that a plurality of semiconductor chip groups CG3, each including a pair of the switching chip 201 and the diode chip 202 shown in FIG. 6, are arranged in parallel between the pair of conductive bases 222 and 223 which are common to all the semiconductor chip groups CG3. The semiconductor chip groups CG3 share the conducting bars 210, 211 and 212 shown in FIG. 6.

It is of course possible to apply the first modification of FIG. 7 to this modification. In that case, as previously described, the user's application of load (pressure) becomes unnecessary.

This modification has the advantage of allowing the flow of larger current than would be possible with only a single pair of chips as shown in FIG. 6 or 7.

4. Summary

The module elements according to the present invention each are equipped with at least one semiconductor chip using a wide gap semiconductor such as silicon carbide or gallium nitride as the base material, which makes it possible to locate the chip in a position where a conventional silicon chip cannot be placed for reasons of the design of heat dissipation. This enables the provision of a small, lightweight and low-cost module element as compared with a conventional one.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a first conductive base comprising a bottom surface exposed to the outside and an upper surface opposed to said bottom surface;

a first metal base comprising a lower surface on said upper surface of said first conductive base and an upper surface opposed to said lower surface;

a first semiconductor chip comprising a first main electrode located on said upper surface of said first metal base and a second main electrode opposed to said first main electrode;

a second metal base comprising a lower surface on said second main electrode of said first semiconductor chip and an upper surface opposed to said lower surface;

a second semiconductor chip comprising a first main electrode located on said upper surface of said second metal base and a second main electrode opposed to said first main electrode;

a third metal base comprising a lower surface on said second main electrode of said second semiconductor chip and an upper surface opposed to said lower surface;

an insulating substrate comprising a lower surface on said upper surface of said third metal base and an upper surface opposed to said lower surface;

a second conductive base comprising a lower surface on said upper surface of said insulating substrate and an upper surface opposed to said lower surface and exposed to the outside;

a first interconnection electrically connecting said first metal base and said third metal base;

a second interconnection electrically connecting said second metal base and said second conductive base; and a container enclosing said first conductive base except an exposed portion of said bottom surface, said first metal base, said first semiconductor chip, said second metal base, said second semiconductor chip, said third metal base, said insulating substrate, said second conductive base except an exposed portion of said upper surface, said first interconnection and said second interconnection in its interior space, wherein said bottom and upper surfaces of said first conductive base have larger areas than said first and second main electrodes of said first semiconductor chip, wherein said lower and upper surfaces of said second conductive base have larger areas than said first and second main electrodes of said second semiconductor chip, and wherein a base material of at least one of said first and second semiconductor chips is a wide gap semiconductor having a greater interband energy gap than silicon.

2. The semiconductor device according to claim 1, further comprising:
- a bonding layer mechanically joining said upper surface of said first conductive base and said lower surface of said first metal base to each other;
- a first conductive layer providing electrical continuity between said upper surface of said first metal base and said first main electrode of said first semiconductor chip;
- a second conductive layer providing electrical continuity between said second main electrode of said first semiconductor chip and said lower surface of said second metal base;
- a third conductive layer providing electrical continuity between said upper surface of said second metal base and said first main electrode of said second semiconductor chip;
- a fourth conductive layer providing electrical continuity between said second main electrode of said second semiconductor chip and said lower surface of said third metal base;
- a first adhesive bonding said upper surface of said third metal base and said lower surface of said insulating substrate; and
- a second adhesive bonding said upper surface of said insulating substrate and said lower surface of said second conductive base.

3. The semiconductor device according to claim 1, wherein
- a base material of the other of said first and second semiconductor chips is also said wide gap semiconductor.

4. The semiconductor device according to claim 1, wherein
- a plurality of semiconductor chip groups, each including one set of said first metal base, said first semiconductor chip, said second metal base, said second semiconductor chip, said third metal base and said insulating substrate, are arranged in parallel between said first conductive base and said second conductive base.

* * * * *